(12) United States Patent
Chang et al.

(10) Patent No.: US 7,002,177 B2
(45) Date of Patent: Feb. 21, 2006

(54) TEST REGION LAYOUT FOR SHALLOW TRENCH ISOLATION

(75) Inventors: Weng Chang, Hsin-Chu (TW); Chih-Cheng Lu, Taipei (TW); Stacey Fu, Taipei (TW); Syun-Ming Jang, Hsin-Chu (TW)

(73) Assignee: Taiwan Semiconductor Manufacturing Co. Ltd., (TW)

( * ) Notice: Subject to any disclaimer, the term of this patent is extended or adjusted under 35 U.S.C. 154(b) by 53 days.

(21) Appl. No.: 10/701,824

(22) Filed: Nov. 5, 2003

(65) Prior Publication Data

US 2005/0095727 A1    May 5, 2005

(51) Int. Cl.
  *H01L 23/58* (2006.01)
  *H01L 27/14* (2006.01)
  *G01R 31/26* (2006.01)

(52) U.S. Cl. .................. 257/48; 257/414; 257/618; 438/14; 438/16

(58) Field of Classification Search .............. 438/14, 438/16; 257/48, 414, 618; 702/117, 81
See application file for complete search history.

(56) References Cited

U.S. PATENT DOCUMENTS

| 6,476,920 B1 | 11/2002 | Scheiner et al. |
| 6,859,748 B1 * | 2/2005 | Yang et al. ................. 702/117 |
| 2002/0043683 A1 | 4/2002 | Nakagawa et al. |
| 2002/0123872 A1 | 9/2002 | Okada |

* cited by examiner

*Primary Examiner*—Hsien-Ming Lee
(74) *Attorney, Agent, or Firm*—Duane Morris LLP

(57) ABSTRACT

A test region layout for testing shallow trench isolation gap fill characteristics is disclosed. Each test region further comprises at least one test pattern disposed in an interior portion of the test region. In a preferred embodiment, the test pattern is a square shape or, more preferably, two diametrically opposed "L" shapes which are discontinuous with respect to each other. It is emphasized that this abstract is provided to comply with the rules requiring an abstract which will allow a searcher or other reader to quickly ascertain the subject matter of the technical disclosure. It is submitted with the understanding that it will not be used to interpret or limit the scope or meaning of the claims.

13 Claims, 3 Drawing Sheets

TEST REGION LAYOUT FOR SHALLOW TRENCH ISOLATION

FIELD OF INVENTION

The present invention relates to test areas of wafers used during semiconductor manufacturing.

BACKGROUND OF THE INVENTION

Referring generally to FIGS. 1a–1e, shallow trench isolation (STI) is an enabling technology for the fabrication of advanced sub-micron integrated devices. A typical STI process sequence includes the following process steps: pad oxide oxidation, LPCVD nitride deposition, trench lithography, trench etch, resist strip/clean, liner oxidation, CVD oxide trench fill, planarization, post-chemical mechanical polishing (CMP) clean/light BHF dip, and nitride strip. This sequence describes STI related processes only and leaves out many other front-end processing steps.

Requirements for STI planarization are much more stringent than those for inter-layer dielectric (ILD) planarization. CMP has been accepted in recent years as a critical step in mainstream integrated circuit fabrication technology, and has enabled the fabrication of multi-level interconnection of up to 5 or 6 metal levels.

Superior isolation characteristics of STI enable scaling of active area pitches to the 0.5 mm regime. This, coupled with the additional advantages of better planarity, latch-up immunity, low junction capacitance, and a near-zero-field encroachment mandates the use of STI in advanced complementary metal-oxide semiconductor (CMOS) technologies.

DETAILED DESCRIPTION OF THE PREFERRED EMBODIMENT

Figure 1A:
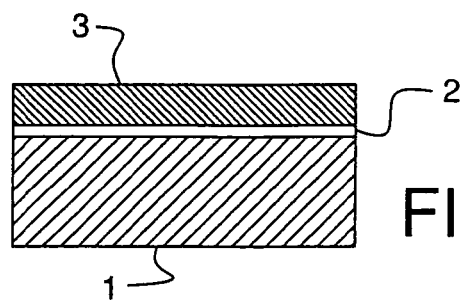
FIGS. 1a–1e are side planar views in cutaway of a typical STI fabrication sequence.
Figure 1B:
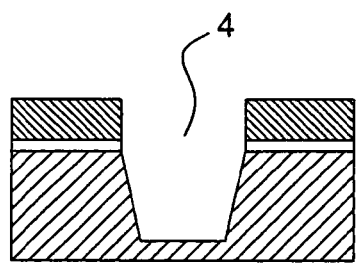
Figure 1C:
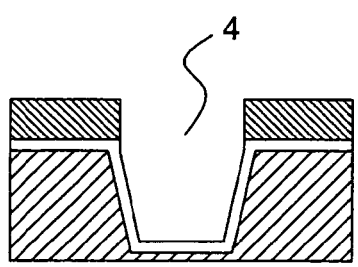
Figure 1D:
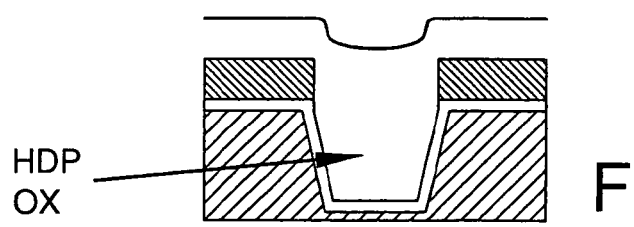
Figure 1E:
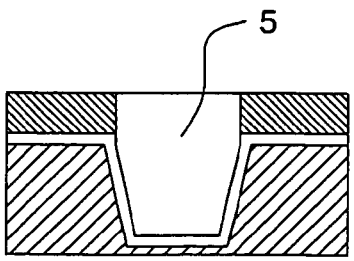
Figure 2:
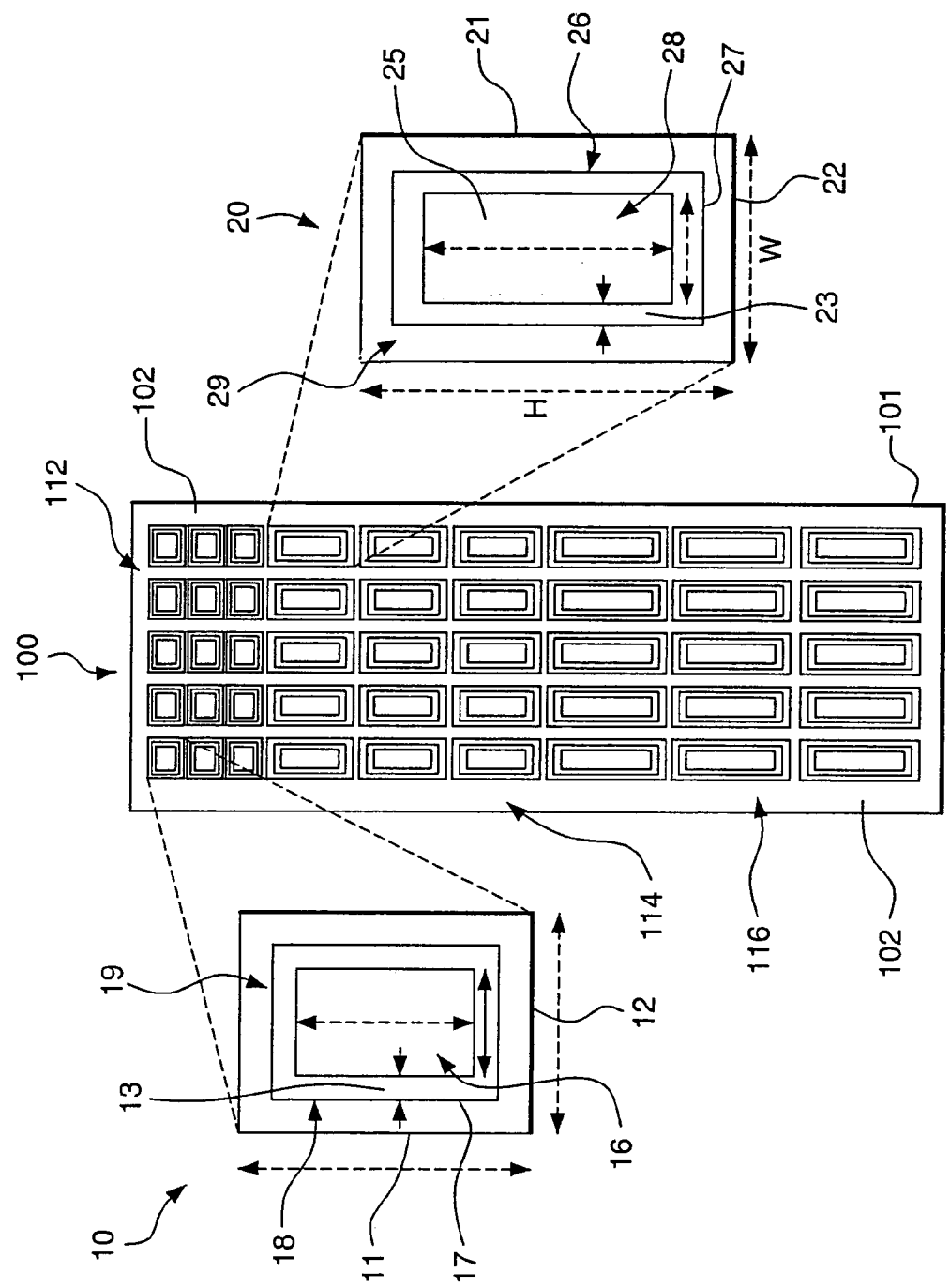
FIG. 2 is a top view of an exemplary set of test regions and a test area.

Referring now to FIG. 2, in an embodiment a gap fill test pattern such as for a shallow trench isolation (STI) gap fill comprises one or more test regions 10,20. Each test region 10,20 further comprises an outer circumference (e.g. comprising sides 11 and 12 or sides 21 and 22) defining first interior area 19, 29 and test pattern 18, 26 disposed in first interior area 19, 29.

Test region 10,20 may comprise a square rectangular region 10, a non-square rectangular region 20, a substantially orthogonal region 20, or the like, or a combination thereof.

In certain embodiments, square rectangular region 10 comprises an area of around 1 $\mu m^2$ and test pattern border 17 defines a square comprising an area of around 0.09 $\mu m^2$, i.e. sides 11 and 12 are around 0.3 $\mu m$. Width 13 may range from around 0.085 $\mu m$ to around 0.200 $\mu m$.

In other embodiments, a non-square rectangular region 20 may comprise an area of around from around 1 $\mu m^2$ to around 3 $\mu m^2$ and test pattern 26 may define a rectangle, comprising border 27 comprising width 23 ranging from around 0.085 $\mu m$ to around 0.200 $\mu m$. Test pattern rectangle 26 further comprises height 25 which be around one-half height 21 of non-square rectangular region 20.

Figure 3:
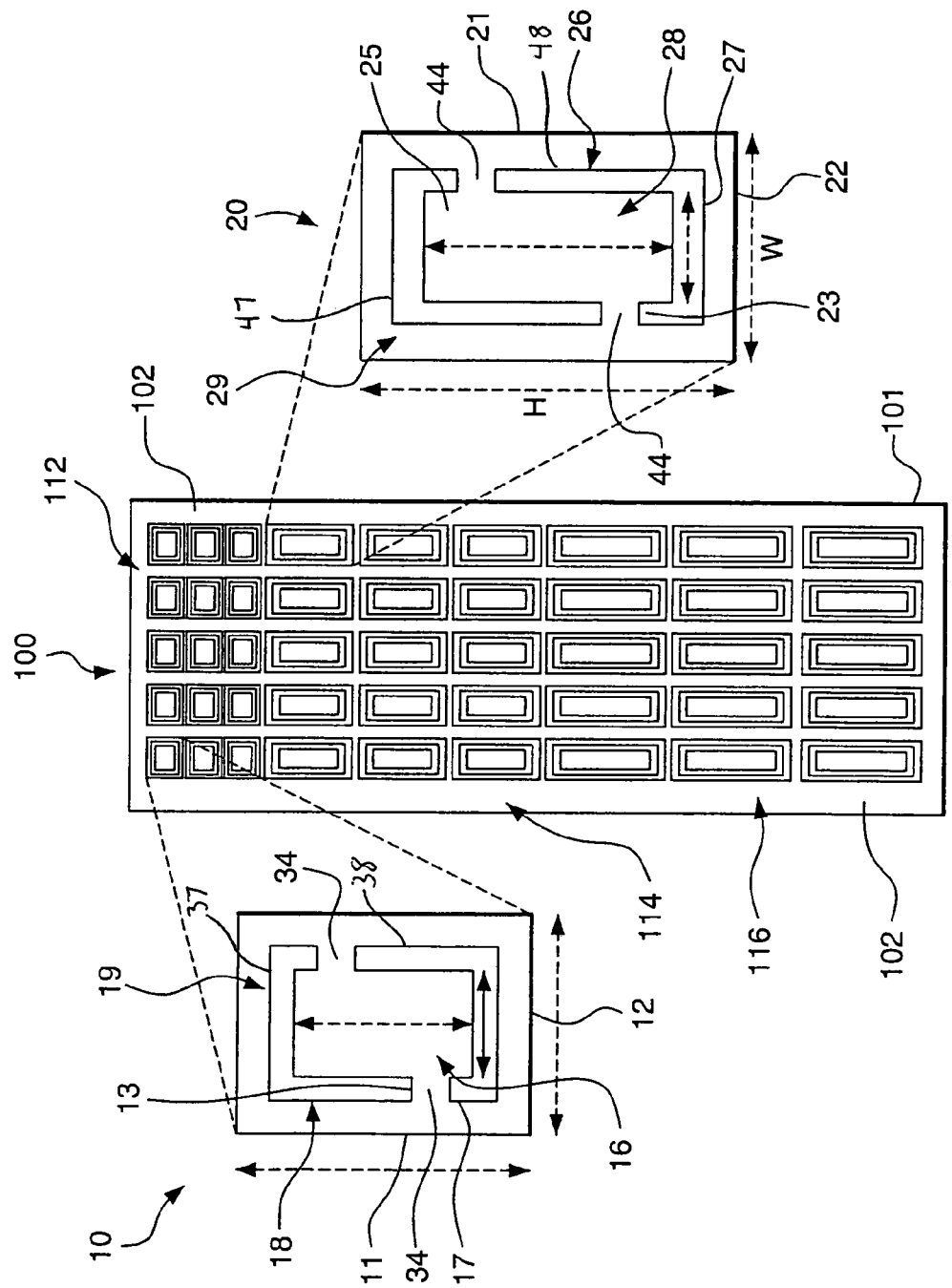
FIG. 3 is a top view of an exemplary set of test regions and a test area.

Referring now to FIG. 3, border 17,27 may be a contiguous border 17 or comprise at least one discontinuity, e.g. 34,44 in border 17,27.

Test regions 10, 20 which comprise a continuous border 17, 27 (FIG. 2) may be adapted to simulate a corner region of a static random access memory cell (not shown in the figures). Test regions 10, 20 which comprise at least one discontinuity 34, 44 (FIG. 3) may be adapted to simulate an outer diameter line end region of a static random access memory cell (not shown in the figures). Discontinuity 34, 44 may be configured as a gap of around 0.1 $\mu m$.

In certain embodiments, a plurality of discontinuities 34, 44 (FIG. 3) may be present in test pattern 18, 26, defining a plurality of discontinuous border segments 37, 38 and 47, 48.

Each border segment 37, 38 and 47, 48 may further comprise a first section intersecting a second section. In a preferred embodiment the first section intersects the second section at a substantially right angle.

Each test pattern 18, 26 may be fabricated using a shallow trench adapted for testing of shallow trench isolation gap fill, the test pattern (18, 26) defining a border (17, 27) that encloses a second interior area (16, 28).

Referring to either FIG. 2 or FIG. 3, a gap fill test region pattern for an STI gap fill may comprise test area 100 fabricated on a predetermined region of a semiconductor wafer. Test area 100 may further comprise border 101 and test region area 102. A plurality of the test regions 10, 20 may be disposed within the test region area 102, each of the test regions 10, 20 comprising the first interior area 19, 29 and the border 17, 27 and the second interior area 16, 28, the test pattern further comprising at least one shallow trench adapted for testing of shallow trench isolation gap fill.

Test area 100 may further comprise and/or define a grid comprising one or more grids, e.g. 112,114,116, the grids further defining a predetermined number of columns and rows within the fabricated test area 100.

An array of first rectangular test regions 10,20 may be disposed within a grid, e.g. 112, where each first rectangular test region 10,20 occupies a unique grid cell defined by a column and row of the grid. An array of second rectangular test regions 10,20 may be further disposed within the grid, e.g. 114, each second rectangular test region occupying a unique grid cell defined by a column and row of that grid 114 where the second rectangular test regions 10,20 further comprise at least one dimension which differs from the dimensions of the first rectangular test regions. For example, the first rectangular test regions 10,20 in grid 112 may be squares and the second rectangular test regions 10,20 in grid 114 may be non-square rectangles.

An array of third rectangular test regions 10,20 may be disposed within test area 100, e.g. in grid 116, where each third rectangular test region 10,20 occupies a unique grid cell defined by a column and row of grid 116. These third rectangular test regions 10,20 may further comprise at least one dimension which differs from a dimension of the first rectangular test regions 10,20, e.g. in grid 112, and at least one dimension which differs from a dimension of the second rectangular test regions 10,20, e.g. in grid 114.

It will be understood that various changes in the details, materials, and arrangements of the parts which have been described and illustrated above in order to explain the nature of this invention may be made by those skilled in the art without departing from the principle and scope of the invention as recited in the appended claims.

We claim:

1. A gap fill test pattern for a shallow trench isolation (STI) gap fill, comprising:
   a. a test region defining a first interior area and a second interior area; and
   b. a test pattern disposed within the first interior area, the test pattern fabricated using a shallow trench adapted for testing of shallow trench isolation gap fill, the test pattern comprising a border at least partially enclosing the second interior area.

2. The gap fill test pattern of claim 1, wherein the test region comprises one of (i) a square rectangular region, (ii) a non-square rectangular region, and (iii) a substantially orthogonal region.

3. The gap fill test pattern of claim 2, wherein:
   a. the square rectangular region comprises an area of around 1 $\mu m^2$;
   b. the test pattern border defines a square comprising an area of around 0.09 $\mu m^2$; and
   c. a width of the test pattern border is from around 0.085 $\mu m$ to around 0.200 $\mu m$.

4. The gap fill test pattern of claim 2, wherein:
   a. the non-square rectangular region comprises an area of from around 1 $\mu m^2$ to around 3 $\mu m^2$;
   b. the test pattern defines a rectangle comprising a width of around 0.3 $\mu m$, the test pattern rectangle further comprising a height of around one-half the height of the rectangular region and a width of from around 0.085 $\mu m$ to around 0.200 $\mu m$.

5. The gap fill test pattern of claim 1, wherein the test pattern border comprises one of (i) a continuous rectangle and (ii) a discontinuous rectangle formed by at least one discontinuity.

6. The gap fill test pattern of claim 5, wherein the continuous rectangle is adapted to simulate a corner region of a static random access memory cell.

7. The gap fill test pattern of claim 5, wherein the discontinuous rectangle is adapted to simulate an outer diameter line end region of a static random access memory cell.

8. The gap fill test pattern of claim 5, wherein the at least one discontinuity forms a gap of around 0.1 $\mu m$.

9. The gap fill test pattern of claim 5, wherein the discontinuous rectangle comprises two discontinuous border segments, each comprising a first section intersecting a second section at a substantially right angle.

10. A gap fill test region pattern for a shallow trench isolation (STI) gap fill, comprising:
    a. a test area fabricated on a predetermined region of a semiconductor wafer, the test area further comprising a border and a test region area;
    b. a plurality of test regions disposed within the test region area, each test region further comprising:
       i. an outer circumference;
       ii. a first interior area; and
       iii. a test pattern disposed in the first interior area, the test pattern comprising a border at least partially enclosing a second interior area, the test pattern further comprising at least one shallow trench adapted for testing of shallow trench isolation gap fill.

11. The gap fill test region pattern of claim 10, further comprising:
    a. an array of first rectangular test regions disposed within a grid, each first rectangular test region occupying a unique grid cell defined by a column and row of the grid; and
    b. an array of second rectangular test regions disposed within the grid, each second rectangular test region occupying a unique grid cell defined by a column and row of the grid, the second rectangular test regions further comprising at least one dimension which differs from the dimensions of the first rectangular test regions.

12. The gap fill test region pattern of claim 11, wherein:
    a. the first rectangular test regions are squares.

13. The gap fill test region pattern of claim 12, further comprising:
    a. an array of third rectangular test regions disposed within the grid, each third rectangular test region occupying a unique grid cell defined by a column and row of the grid, the third rectangular test regions further comprising at least one dimension which differs from a dimension of the first rectangular test regions and at least one dimension which differs from a dimension of the second rectangular test regions.

* * * * *